United States Patent [19]

Tokugawa et al.

[11] 4,315,135

[45] Feb. 9, 1982

[54] THERMAL RECORDING HEAD

[75] Inventors: Fumitake Tokugawa; Etsuo Hatabe, both of Amagasaki, Japan

[73] Assignee: Mitsubishi Denki Kabushiki Kaisha, Tokyo, Japan

[21] Appl. No.: 68,341

[22] Filed: Aug. 21, 1979

[30] Foreign Application Priority Data

Aug. 21, 1978 [JP] Japan .................................. 53-101975
Sep. 12, 1978 [JP] Japan .................................. 53-112615

[51] Int. Cl.³ .............................................. H05B 1/00
[52] U.S. Cl. ................................. 219/216; 101/93.04; 178/31; 346/76 R; 346/76 PH; 346/151
[58] Field of Search ................... 219/216, 543; 101/93.04; 178/23 R, 30, 31; 346/76 PH, 165, 151, 76 R; 400/120; 250/216; 340/173, 174; 345/105, 126; 358/129; 355/300

[56] References Cited

U.S. PATENT DOCUMENTS

| | | | |
|---|---|---|---|
| 3,354,817 | 11/1967 | Sakurai | 101/93.04 |
| 4,136,274 | 1/1979 | Shibata et al. | 219/216 |
| 4,138,605 | 2/1979 | Stapleton et al. | 219/216 |
| 4,141,018 | 2/1979 | Mizaguchi et al. | 346/76 R |
| 4,203,119 | 5/1980 | Naguib et al. | 346/76 PH |
| 4,204,107 | 5/1980 | Ohkubo et al. | 219/216 |
| 4,232,212 | 11/1980 | Baraff et al. | 219/216 |
| 4,250,375 | 2/1981 | Tsutsumi et al. | 219/216 |

FOREIGN PATENT DOCUMENTS 40-6040 3/1965 Japan.

Primary Examiner—Volodymyr Y. Mayewsky
Attorney, Agent, or Firm—Oblon, Fisher, Spivak, McClelland & Maier

[57] ABSTRACT

A thermal recording head comprises a supporting substrate having a wiring pattern wherein a plurality of heating elements arranged linearly and a plurality of lead-out wires connected respectively to each heating element are formed on the end surface and said lead-out wires are elongated to the adjacent side surface selective terminals connected to a plurality of said heating elements a wiring substrate having a wiring pattern having signal terminals for applying a selective signal for selecting said heating elements and a diode matrix connected to said terminals; a plurality of diodes which are connected between said wiring pattern on said supporting substrate and said wiring pattern on said wiring substrate and which form said diode matrix in the space facing said wiring patterns.

6 Claims, 16 Drawing Figures

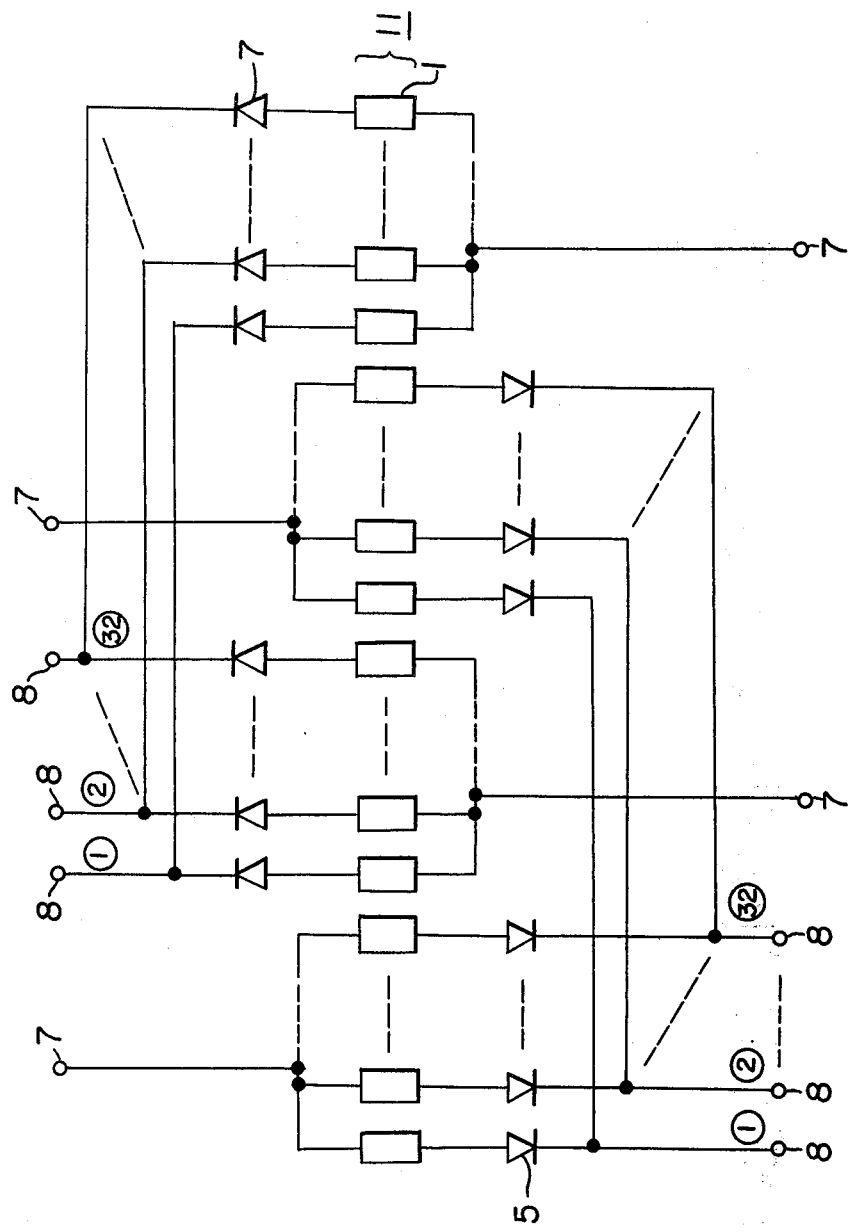
F I G. 7

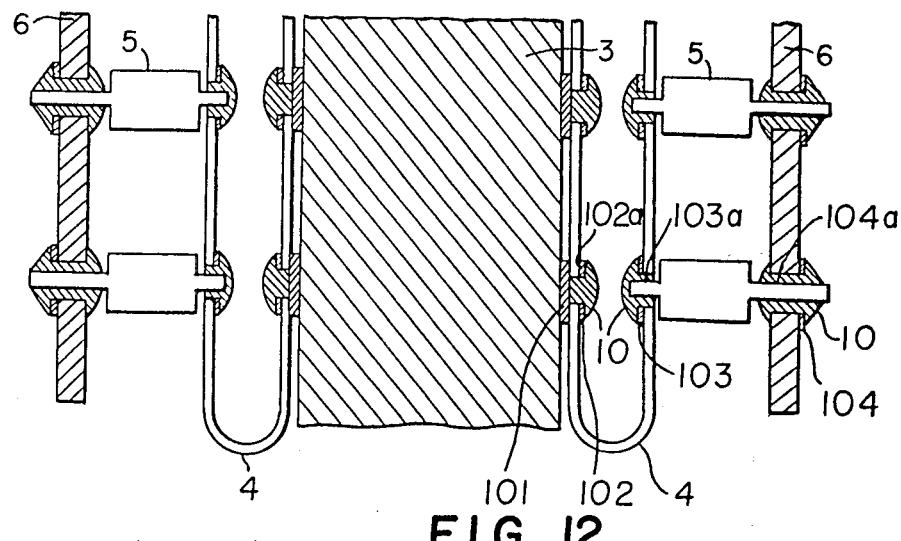
FIG. 12
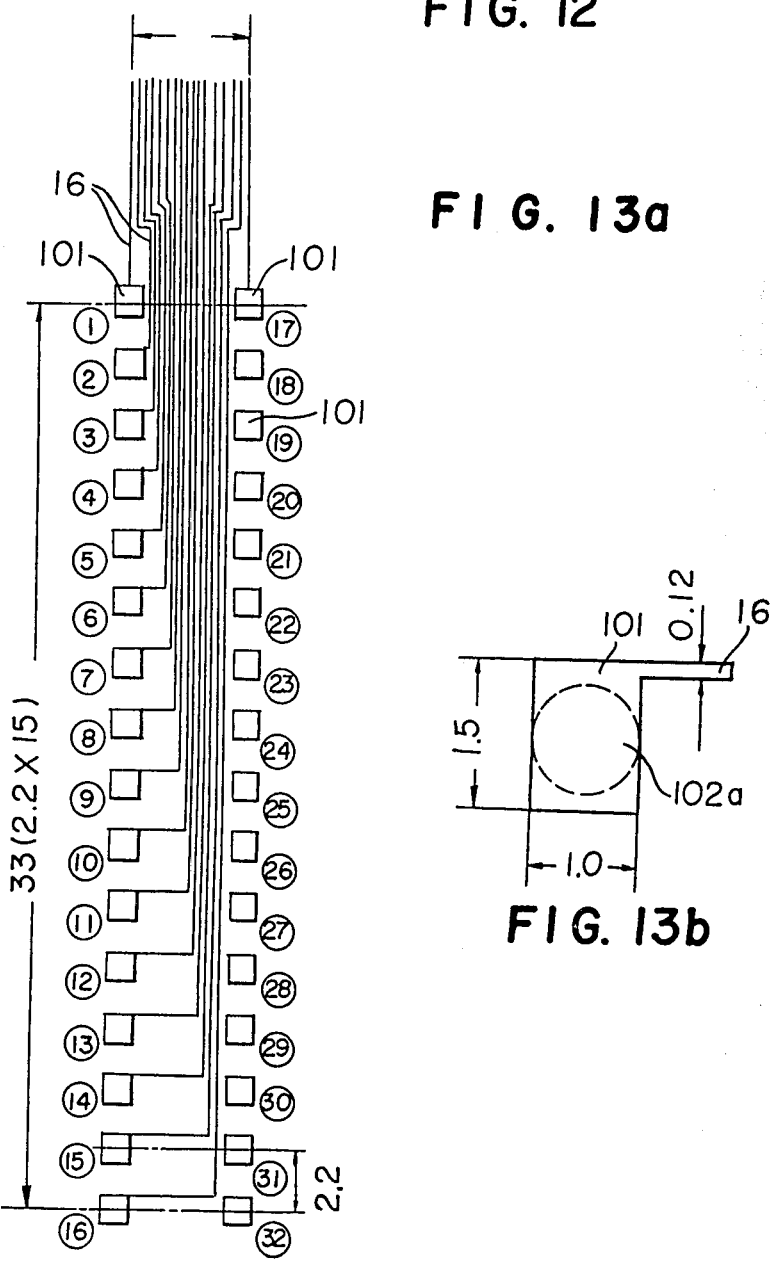
FIG. 13a
FIG. 13b

FIG. 15
FIG. 16
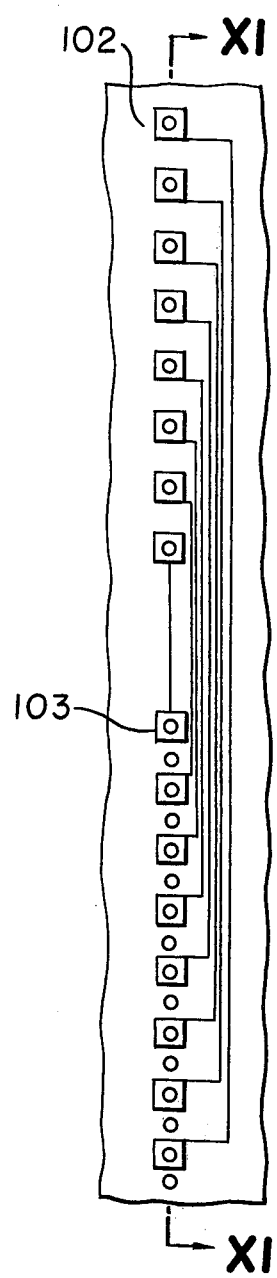
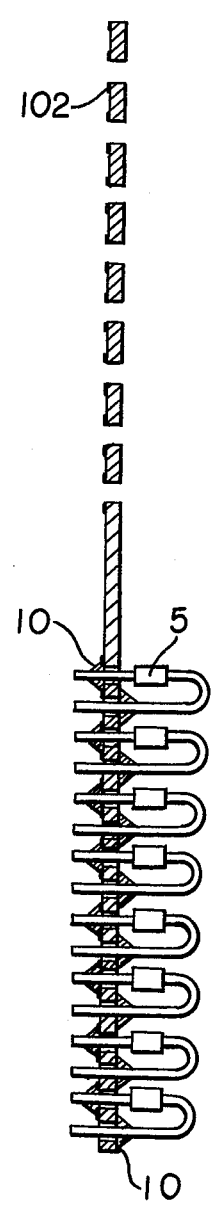

THERMAL RECORDING HEAD

BACKGROUND OF THE INVENTION

1. Field of the Invention

The present invention relates to a thermal recording head used for a facsimile or a printer. More particularly, it relates to a structure of the thermal recording head assembly.

2. Description of Prior Art

Various conventional thermal recording heads will be illustrated. A thermal recording head comprises heating elements as recording elements; lead wires and wiring which are electrically connected to the heating elements; a diode matrix required for sequentially driving the heating elements; selective terminals required for selecting groups of the heating elements; an input terminal for the input of a recording signal; and a supporting substrate for supporting the heating elements as minimum components.

FIG. 1 is a partially broken schematic view of one example of a conventional alternate lead output type thermal recording head.

In FIG. 1, the reference numeral (11) designates a heating array in which 1280 heating elements (1) are linearly arranged in a density of 6 elements per mm for a length of about 200 mm; (2) designates a lead-out wire which feeds a signal power required for the recording of the heating elements; (3) designates a supporting substrate of a ceramic plate on which the heating elements (1) and the lead-out wire (2) are fixed by sintering; (4) designates a flexible substrate; (41) designates wiring which is placed on the lower surface of the substrate and a third land part (103) to which one terminal of the diode (5) is soldered. In particular, the supporting substrate (3) and the flexible substrate (4) are press-contacted by a fitting which is not shown. The reference (6) designates a printed wiring substrate; (61) designates wiring; (104) designates a fourth land part to which the other terminal of the diode (5) is soldered. A hole (9) for inserting the terminal of the diode (5) is formed in each of the third and fourth land parts. The wiring pattern on the flexible substrate (4) is a parallel wiring which connects the lead-out wire (2) on the supporting substrate (3) to one terminal of the diode (5). On the other hand, the wiring pattern (61) of the printed wiring substrate (6) has a matrix having m rows and n columns which connects the other terminal of the diodes (5) to selective terminals (7) or signal terminals (8). (In this example, the number of selective terminals n=40; the number of signal terminals m=32).

The selective signal of the heating elements is applied to the selective terminals (7) and the driving signal for the heating elements is applied to the signal terminals (8). In FIG. 1, 320, 60, 120, 130 and 10 are lengths having units of mm.

FIG. 2 is a circuit diagram of the thermal recording head shown in FIG. 1.

FIG. 3 is a circuit diagram of connections of three heating elements on the substrates in the circuit of FIG. 2.

In FIGS. 1 and 2, only parts of the wiring pattern, the diode and the terminals are shown. The sizes of the parts are relatively large as shown in FIG. 1.

FIG. 4 is a schematic view of a other conventional recording head. All components are formed on one surface of the supporting substrate (3) made of ceramic by a thin film technology.

In FIG. 4, 130 and 200 are lengths having units of mm. The heating element array (11) is about 190 mm long and is linearly arranged by dividing it into two groups by a center line. Each group has 4 elements per mm and has 24 selective terminals (7) and 32 signal terminals (8). The lead-out wires (2) from the heating elements (1) are respectively connected to the selective terminals (7) from 32 heating elements and the other sides of the lead-out wires (2) are respectively connected through the third joints (103) to the terminals of the diodes (5) arranged in the array. The other terminals of the diodes (5) are respectively connected through a thin film matrix circuit (42) to the signal terminals (8) by multi-layer wirings.

In FIG. 4 only part of the wiring pattern, the diode matrix, the terminals are shown. The sizes of the parts are as shown in FIG. 4.

The examples of conventional thermal recording heads shown in FIGS. 1 to 4 are typical ones used for commercial facsimile receivers. In view of market needs for facsimile devices and the development of technology related to facsimile, these factors are required: a decrease in cost, good performance and a compact size. These requirements are highly dependent upon the assembly and connections of the parts of the thermal recording head. In view of these requirements, the conventional examples shown in FIGS. 1 and 4 have the following disadvantages.

In the example shown in FIG. 1, the accuracy of the pattern of the wiring (41) on the flexible substrate (4) cannot be increased in the manufacturing process. In practice, only 3 wires per mm in the alternate lead-out wires are provided, at most. Therefore, the pitch of the heating elements (1) cannot be as dense as 8 elements per mm which is required for a highspeed facsimile receiver. A more compact size of the diode matrix connected from the flexible substrate (4) in parallel wiring can not be attained. This prevents a compact size of the facsimile body.

In the example shown in FIG. 4, whole parts are made by thin film circuit technology. Therefore, it is expensive to manufacture them at costs in mass production and it requires long processing times. In the multi-layer wirings for forming the diode matrix in the thin film circuit, the density of the lead-out wires (2) and the connecting parts are increased according to the increase of the density of the heating elements in their arrangement. Therefore, the percentage of devices without defects is substantially decreased.

The formation of the thin film circuits is made on one surface of the supporting substrate. Therefore, the joints are concentrated on the same surface whereby the plane area of each supporting substrate (3) is increased. Therefore, in order to form a compact facsimile apparatus of a transmitting type, a receiving type or a common type, the arrangement of the parts is severely limited. When the supporting substrate (3) is spread in the recording paper running direction near the recording surface (the surface for contacting the heating elements (1) with the heat sensitive paper (not shown)), the degree of spacial freedom in the design of the recording paper feeding system is disadvantageously decreased.

SUMMARY OF THE INVENTION

It is an object of the present invention to provide a miniaturizing of the thermal recording head; and Another object of the present invention is to provide a decrease in cost and an improvement of reliability of thermal recording heads and an improvement for decreasing the percentage of defects in the manufacture of thermal recording heads.

BRIEF DESCRIPTION OF THE DRAWINGS

FIG. 7 is a circuit diagram of the embodiment shown in FIG. 5;

FIG. 12 is a sectional view taken along the line XII—XII of FIG. 10;

FIG. 13(a) is a view of a part of the wiring pattern on the supporting substrate;

FIG. 13(b) is a partially enlarged view of its land part;

FIG. 15 is a partial front view of the flexible wiring substrate; and

FIG. 16 is a sectional view of the substrate shown in FIG. 15.

DETAILED DESCRIPTION OF THE PREFERRED EMBODIMENTS

The present invention is designed to overcome the disadvantages of the conventional thermal recording head by forming a diode matrix on both side surfaces of a supporting substrate (3) for forming the heating elements. (The side surfaces are surfaces perpendicular to recording surface.)

Figure 5:
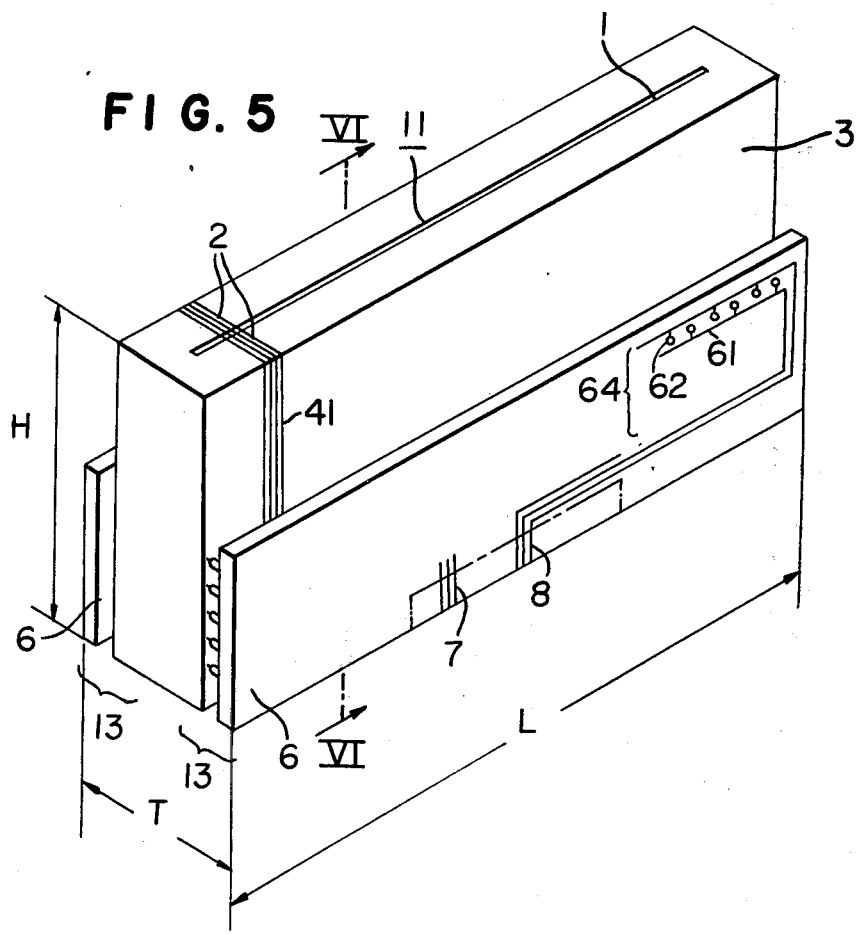
FIG. 5 is a schematic view of one embodiment of the thermal recording head of the present invention.
Figure 6:
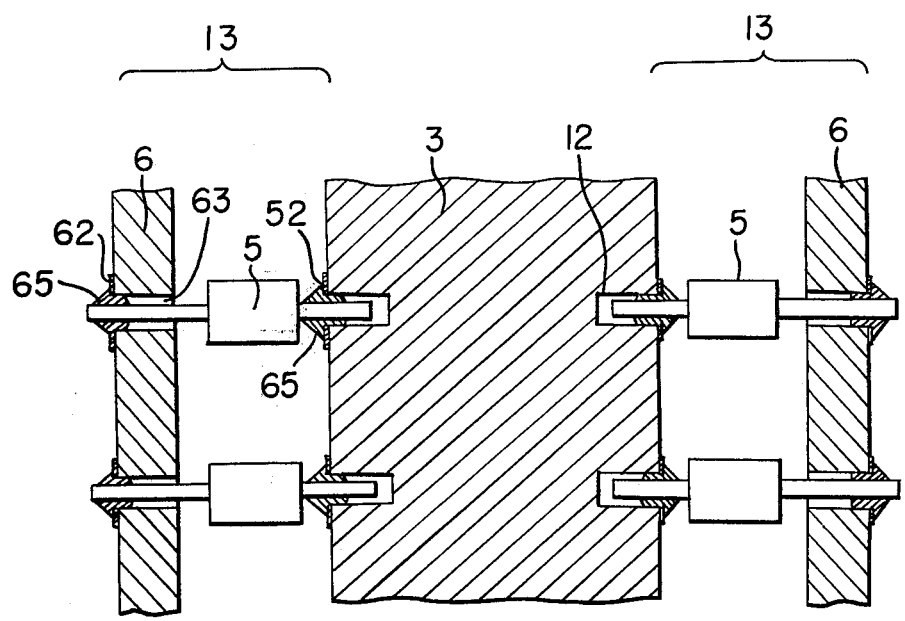
FIG. 6 is a partially enlarged sectional view taken along the VI—VI line of FIG. 5.
Figure 8:
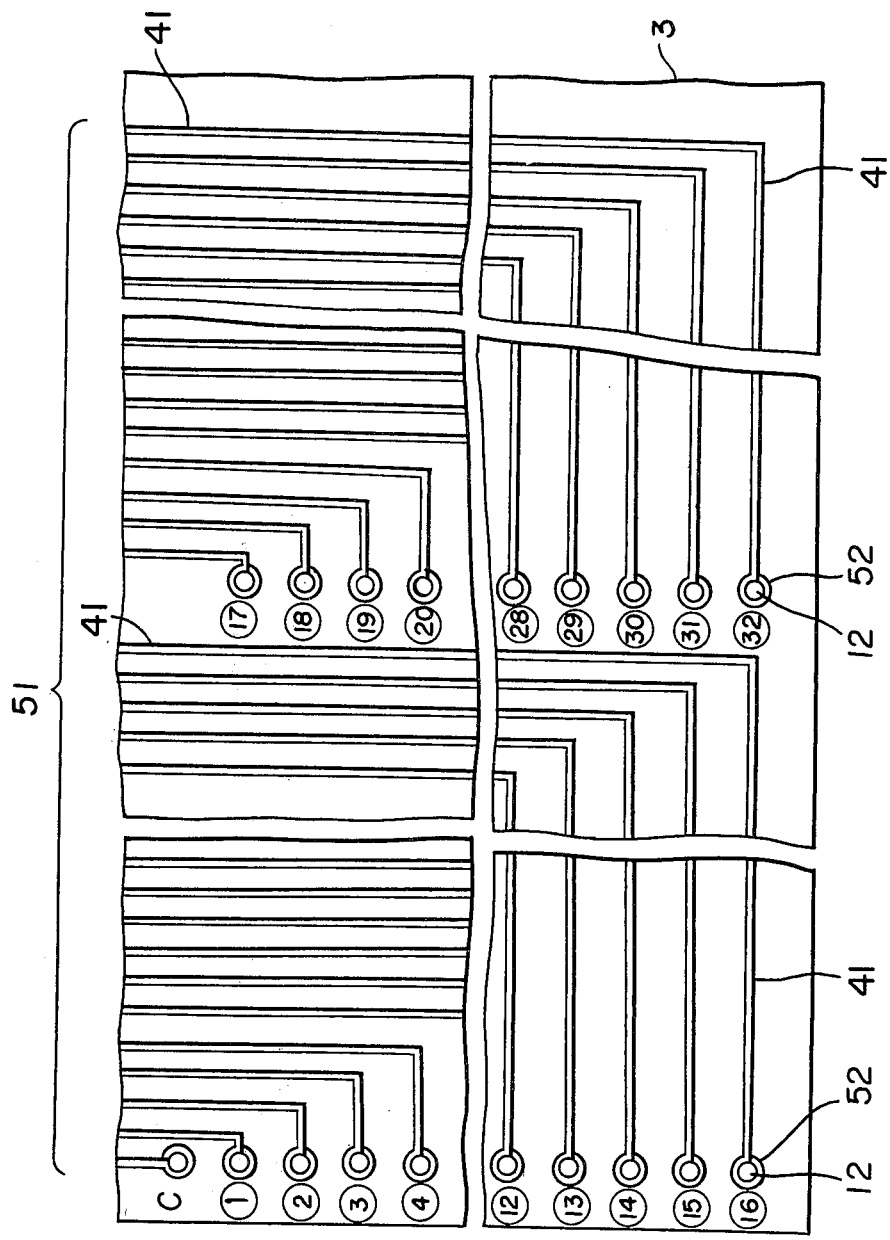
FIG. 8 is a partially enlarged view of a wiring pattern of a diode matrix formed on each side surface of a supporting substrate in the embodiment shown in FIG. 5.
Figure 9:
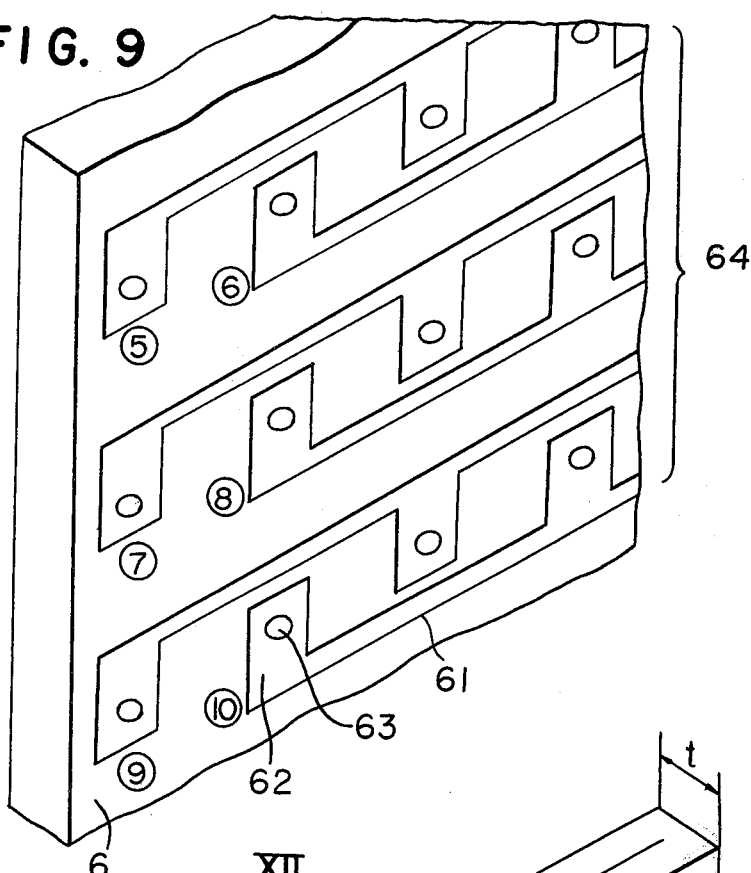
FIG. 9 is a partially enlarged view of a wiring pattern of a diode matrix formed on a wiring substrate in the embodiment shown in FIG. 5.

FIG. 5 is a schematic view of one embodiment of the present invention; FIG. 6 is a partially enlarged sectional view taken along the line VI—VI of FIG. 5; FIG. 7 is a circuit diagram thereof; FIG. 8 is a partially enlarged view of a parallel wiring pattern for on the supporting substrate (3); and FIG. 9 is a partially enlarged view of a wiring pattern for the diode matrix on the wiring substrate (6).

In the drawings, the reference numeral (12) designates a hole for inserting the lead wire of the diode (5) formed on the supporting substrate (3); (52) designates a land part of the wiring pattern (51); (65) designates a solder connection; and the diode matrix (13) is formed on the facing surfaces of the supporting substrate (3) and the wiring substrate (6).

The densities of the wiring patterns (51), (64) of the matrix forming parts on the surfaces of the supporting substrate (3) and the wiring substrate (6) are remarkably decreased in such a structure even though the number of the heating elements is the same as that in the conventional.

The case of a thermal recording head having 128 heating elements, 4 selective terminals; and 32 signal terminals is shown in FIG. 7. Two wires to the selective terminals (7) and 64 wires to the signal terminal (8) are placed on each side surface of the supporting substrate (3).

FIG. 8 is a partially enlarged view of a parallel wiring pattern (51) on the supporting substrate (3). The lead wires for the diodes (5) at the anode side are inserted into the holes (12) and are soldered on the land parts (52).

The arabic numerals having symbol ○ show the numbers of the holes. The supporting substrate (3) is made of glass or epoxy resin. Satisfactory accuracy and a satisfactory non-defect percentage can be attained for a pattern of the wiring (2) having about 5 lines per mm by conventional techniques. Accordingly, the density of the arrangement of the heating element array (11) can be about 10 elements per mm by conventional techniques.

FIG. 9 is a partially enlarged view of a matrix wiring pattern (64) on the wiring substrate (6). The matrix wirings are connected from the diodes (5) at the cathode side to 32 signal terminals (8) shown in FIG. 7. Two selective wires and 32 signal wires on each side of the supporting substrate (3) are placed on one side surface and respectively connected to the selective terminals (7) and the signal terminals (8) shown in FIG. 5.

The case of a heating element array (11) having 1280 heating elements arranged at a density of 6 elements per mm which is formed in a matrix having 40 selective terminals (7) and 32 signal terminals (8) will be considered.

A compact thermal recording head having a length L of 220 mm., a thickness of the supporting substrate (3) of about 20 mm. and a total thickness (T) of the substrate and the diodes of about 40 mm. and a pitch of the diodes (5) on the supporting substrate (3) of about 2.5 mm. gives a height of the supporting substrate (3) of about 60 mm. can be obtained. In accordance with the present invention, a compact thermal recording head can be obtained.

The structure of the thermal recording head is not limited to that of the embodiment shown and can be modified as desired.

For example, the heating element array (11) can be directly connected to the supporting substrate (3) or a heating element substrate made of a ceramic on which the heating element array is connected can be bonded to the supporting substrate (3). The preparation and structure of the heating element array (11) can be a thick film type, a thin film type, a semiconductor type, a common lead-out type, an alternate lead-out type, etc.

The pattern of the lead-out wires (2) and the connections to the diodes on the supporting substrate can be formed by a metallizing method, a printing method, an etching method, a cutting method, etc.

The pattern can be formed on a supporting substrate prepared by laminating a glass plate, a polyimide resin, a glass-epoxy resin etc.

The diode (5) can be inserted in the hole (12) of the land part (51) formed on the supporting substrate (3) or can be directly soldered to the land part (51) without a hole (12).

The hole (12) can be communicated from one side to the other side though it is not always necessary.

The diodes (5) need not to be perpendicular to the supporting substrate (3). In view of an easier operation for assembling, it is preferable to place the diodes with a certain angle to the supporting substrate (3).

The wiring substrate (6) used for the matrix wiring can be formed by urethane metallic wires whose insulating coating can be removed by heating.

The other embodiment of the present invention will be illustrated.

Figure 10:
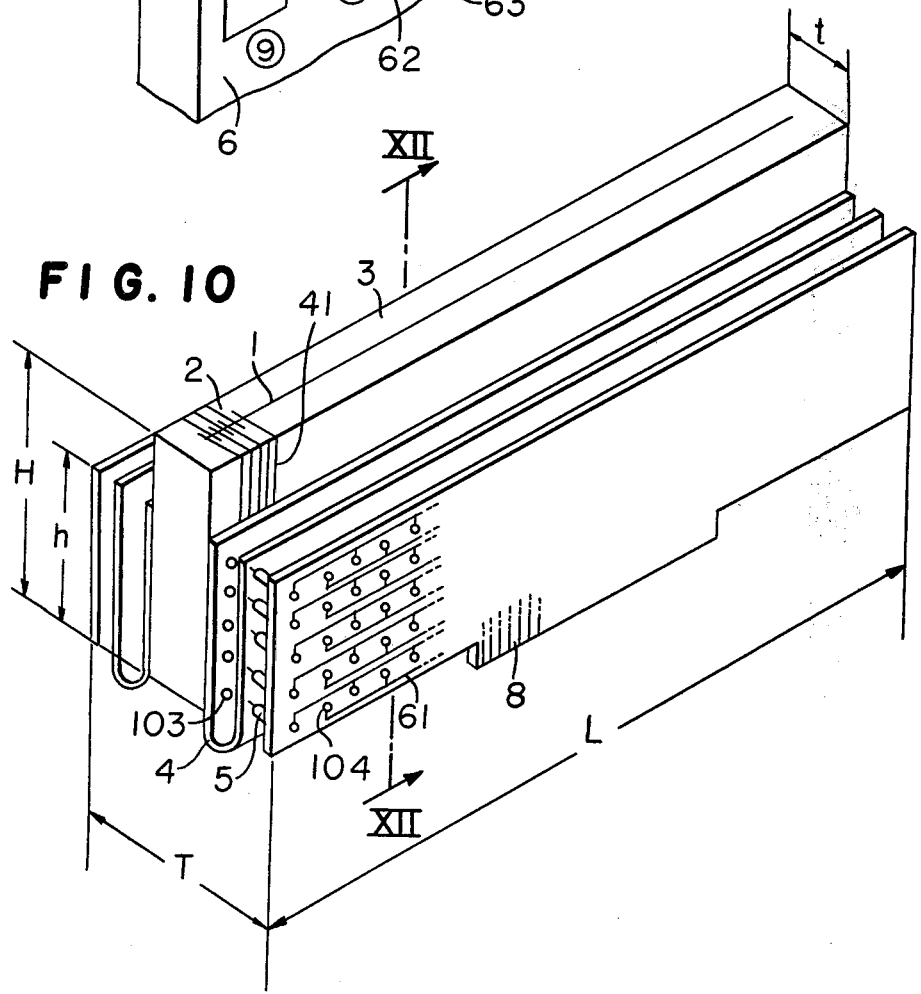
FIG. 10 is a schematic view of another embodiment of the present invention.
Figure 11:
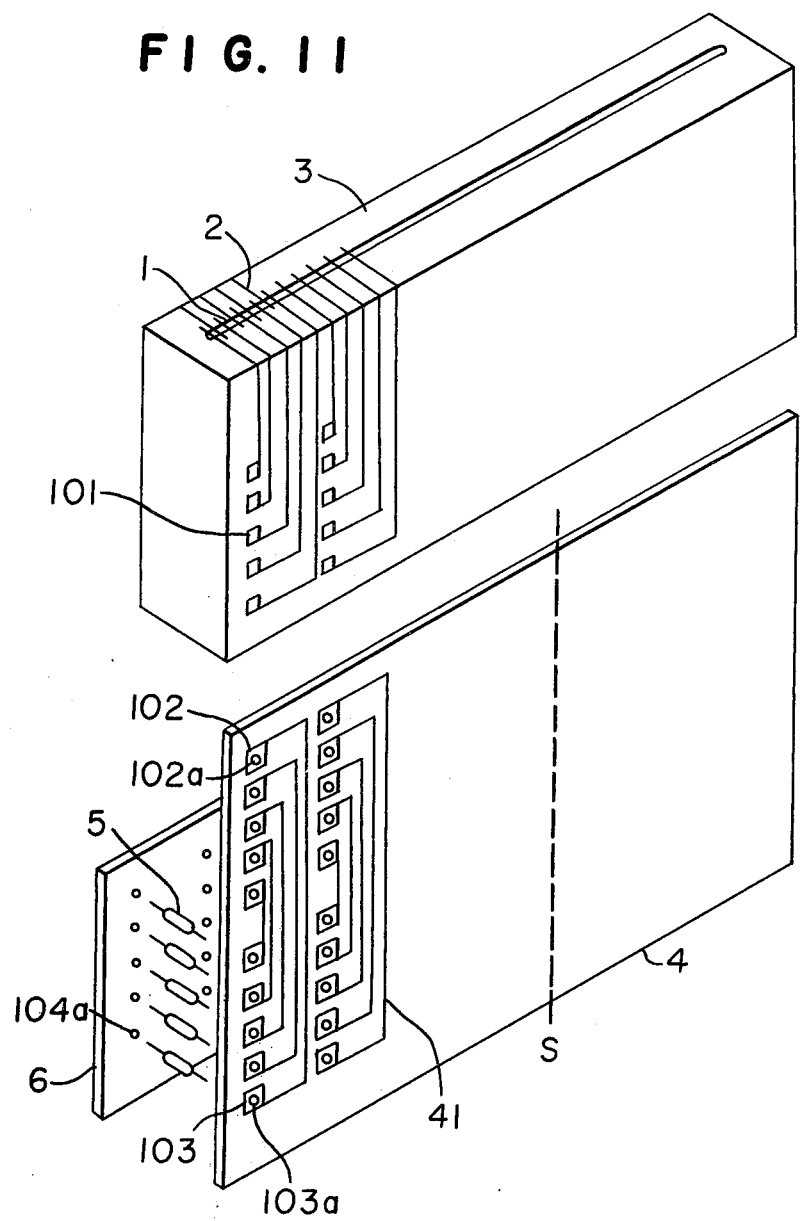
FIG. 11 is a disassembled schematic view of the embodiment shown in FIG. 10.

FIG. 10 is a schematic view of one embodiment of the present invention; FIG. 11 is a disassembled view of a part shown in FIG. 10; (for purposes of description, only 5 of diodes and the corresponding parts are shown).

FIG. 12 is a partially enlarged sectional view taken along the line XII—XII in FIG. 10. The alternate lead-out type of thermal recording head is shown.

In the above-mentioned embodiment, the lead-out wire (2) on the end surface of the supporting substrate on which the heating elements are placed, can be a continuation of the lead-out wire elongating wiring on the side surface of the supporting substrate (3) or the wiring substrate can be bonded to the side surface of the supporting substrate (3).

Figure 1:
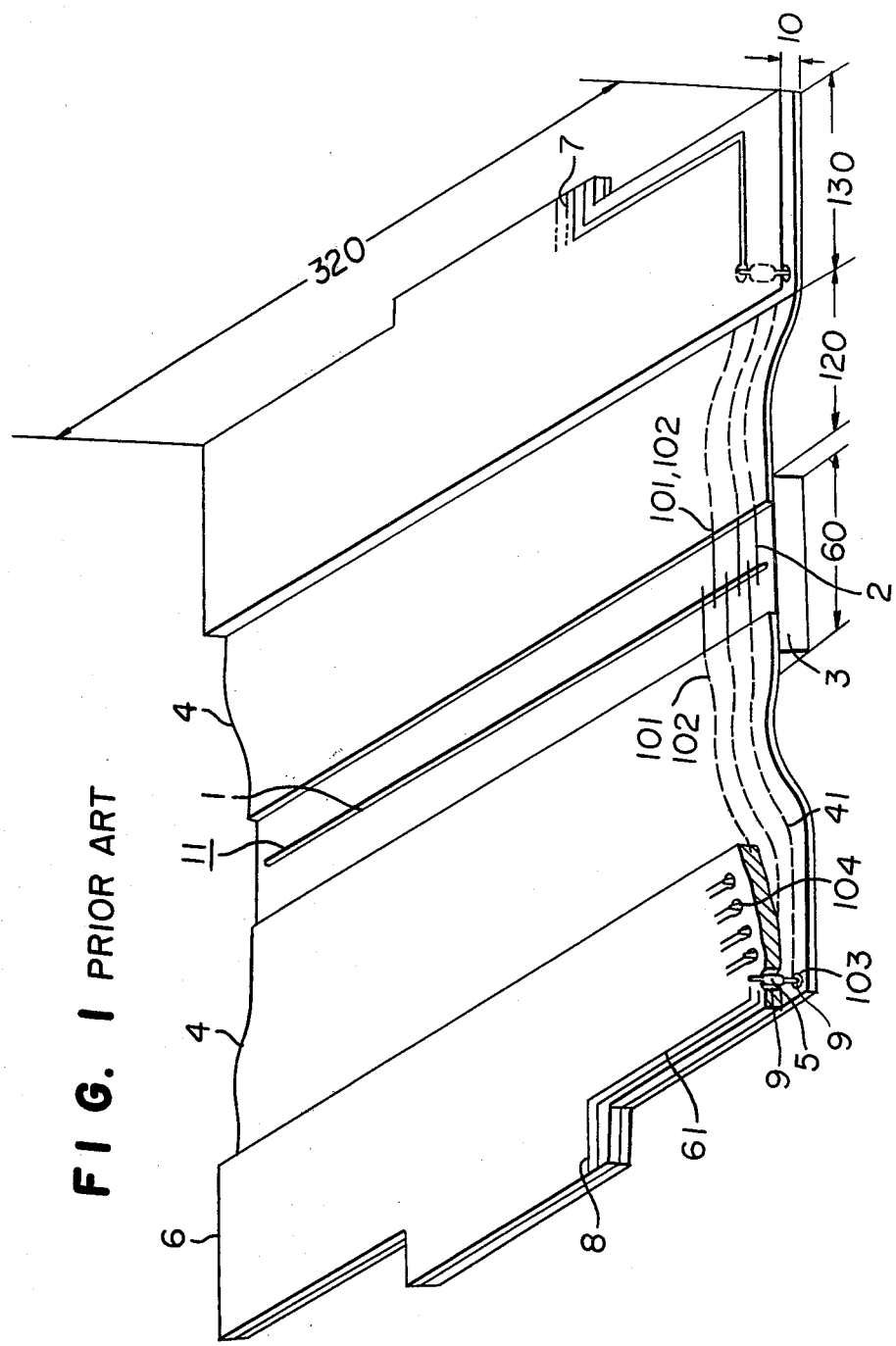
FIG. 1 is a partially broken schematic view of a prior art thermal recording head.
Figure 2:
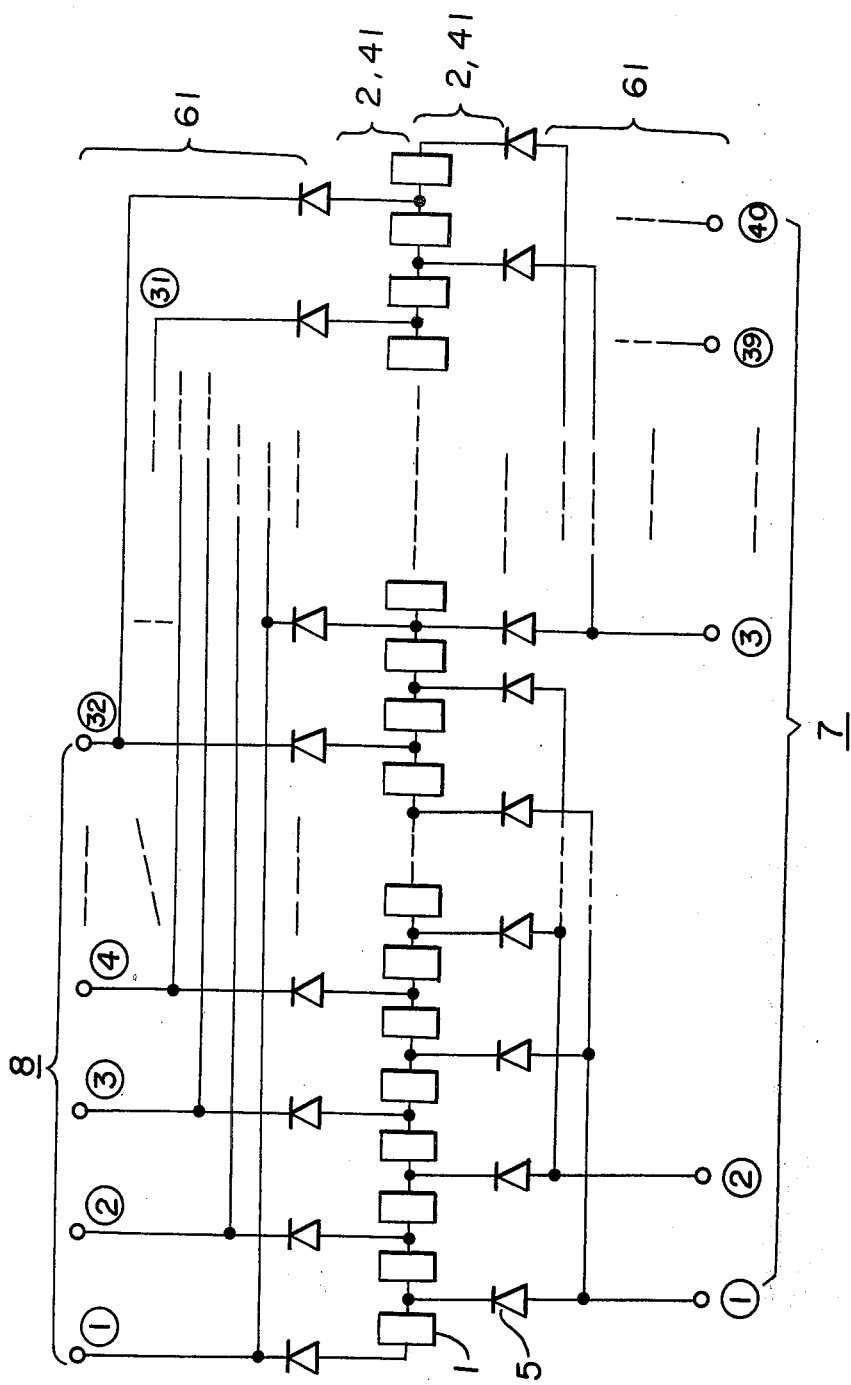
FIG. 2 is a circuit diagram of the prior art thermal recording head shown in FIG. 1.
Figure 3:
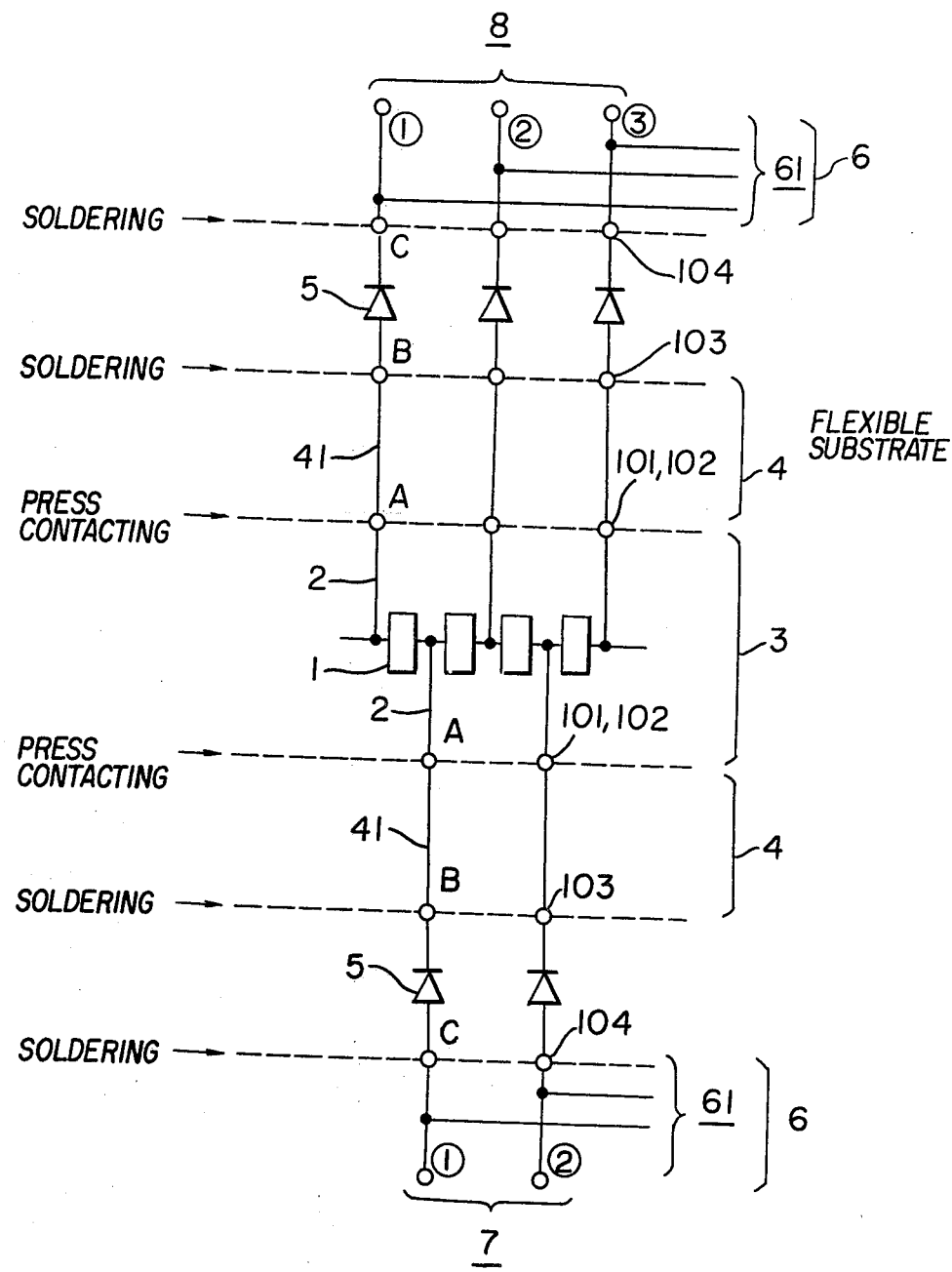
FIG. 3 is a circuit diagram of connections shown in FIG. 1.
Figure 4:
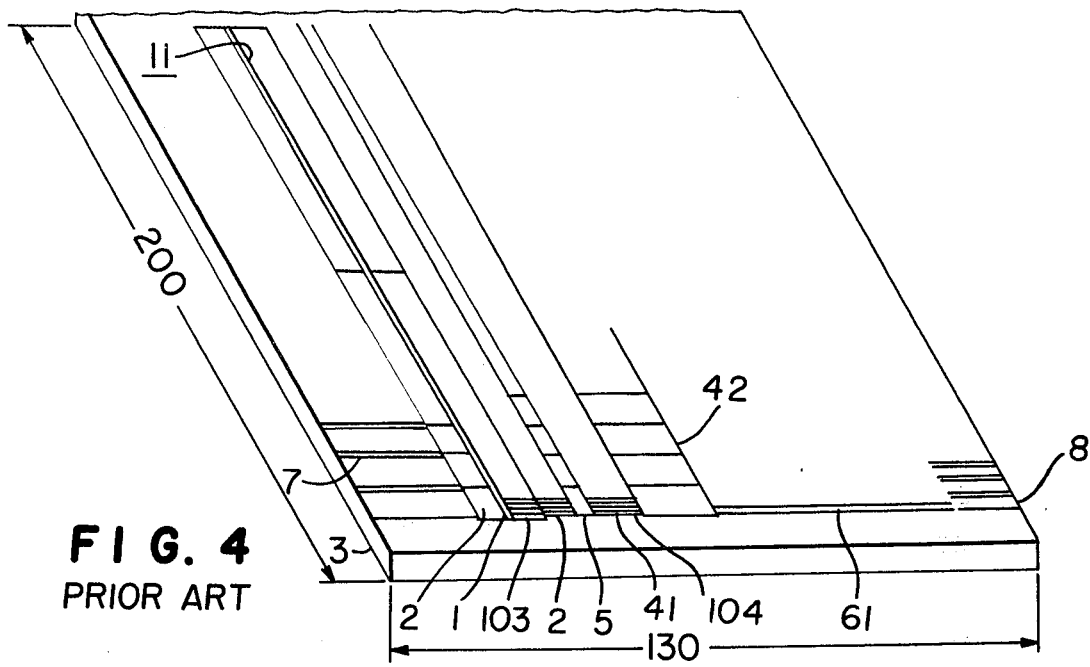
FIG. 4 is a schematic view of another prior art thermal recording head.

As shown in FIG. 11, the wiring is not exposed except at the first land part (101) on the side surface of the supporting substrate (3). The wiring pattern is formed on the flexible substrate (4) and the second land part (102) is arranged to overlap the first land part (101). A hole (102a) having a diameter of about 1 mm. is formed at a center of the second land part (102). As shown in the sectional view of FIG. 12, the first and second land parts (101), (102) are bonded by a solder connection (10). This corresponds to the electric connection of the lead-out wire (2) on the supporting substrate (3) and the wiring (41) on the flexible substrate (4) by pressing in the prior art device of FIG. 1.

In the embodiment of the present invention, the land parts (101), (102) for soldering are arranged with a pitch of about 2 to 2.5 mm. The soldering can be easily carried out with high accuracy without a requirement for high skill nor special equipment.

In the flexible substrate (4), it is preferable to coat the conductive lines except the second and third land parts (102), (103) with a solder resist.

A hole (103a) having a diameter of about 0.7 mm. is formed at the center of the third land (103) on the flexible substrate (4) similar to that of the second land part (102). One terminal of the diode (5) is inserted into the hole and is soldered. The other terminal of the diode is inserted into the hole (104a) which is formed at the center of the fourth land part (104) corresponding to the print wiring substrate (6) and is soldered.

The case of the alternate lead-out type thermal recording head having 1728 heating elements (1) arranged in an array and with the number of selective terminals n being 27 and the number of the signal terminals m being 64, will be illustrated to show sizes in the embodiments.

FIG. 13(a) shows one unit of the wiring pattern formed on the supporting substrate. This is the alternate lead-out type. Accordingly, the density of the lead-out wire (2) is 4 wires per mm on the side surface of the supporting substrate (3). Moreover, in order to maintain the first land part (101), the density of the wiring pattern near the first land part (101) is 5 wires per mm. As described above, the wiring is not exposed except the land parts by coating a solder resist etc.

FIG. 13(b) shows a partially enlarged view of one of the first land parts (101). The size of the first land parts (101) is 1.5×1.0 mm. The width of the wire (16) from the land part is 0.12 mm.

Each side surface of the supporting substrate (3) has 54 rows in each of which 16 land parts (101) are linearly arranged. The density of the wiring pattern on the flexible substrate (4) is the same as the one the surface of the supporting substrate (3) shown in FIG. 13(a). The first land part (101) and the second land part (102) are fixed by soldering through the hole (102a) at the center. This operation can be easy carried out without flowing to the adjacent land part.

Figure 14:
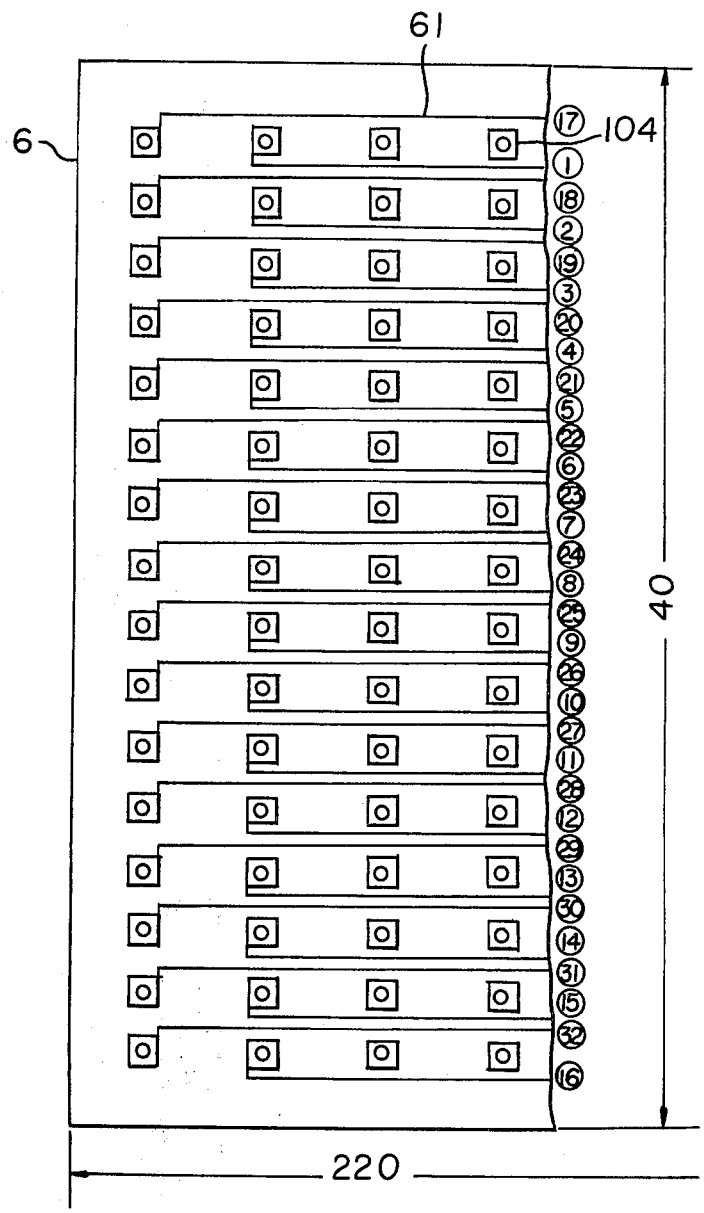
FIG. 14 is a partial front view of a print wiring substrate.

FIG. 14 is a front view of a part of the print wiring substrate (6).

The numerals in the symbol ◯ shown in FIGS. 13(a) and 14 are the numbers of the signal terminals in the alternate lead-out type head to show the fact that 1–64 are distributed on the double surface printed wiring substrate. The land parts and the wirings are arranged as described, whereby the print wiring substrate (6) having a length (L) of 220 mm. and a height (h) of 40 mm. and the supporting substrate (3) having a height (H) of 60 mm. and a thickness (t) of 20 mm. are used to form a thermal recording head having a thickness (T) of about 40 mm.

In accordance with the embodiment of the present invention, the assembling of the flexible substrate (4), the diodes (5) and the print wiring substrate (6) which are connected to the supporting substrate (3) can be easily carried out with high accuracy by soldering. The size accuracy of the flexible substrate (4) required for position fitting can be reduced. Sometimes, as shown by the broken line S in FIG. 11, two or more divided flexible substrates can be prepared to improve the non-defect percentage.

The thermal recording head used for the present invention is not limited to the alternate lead-out type, but can be the thick film type, the thin film type or the semiconductor type.

The shape and material of the supporting substrate (3) is not limited when the first land part (101) can be formed on the side surface. The flexible substrate (4) in the embodiment can be substituted by a nonflexible wiring substrate.

The other embodiment having a large number m of the signal terminals compared to the number n of the selective terminals for example, n=2 and m=128 in the matrix will be illustrated.

The function of the print wiring substrate (6) in such case is to fix one terminal of the diode (5) and the effect on the matrix is not remarkable.

In such case, the first wiring substrate (4) can be a thin double surface substrate or a laminated substrate bonding the second wiring substrate (6) on the first wiring substrate (4).

FIG. 15 is a partial front view of the wiring substrate (4) and FIG. 16 is a sectional view of FIG. 15.

As shown in the embodiment, when the diodes (5) are placed on one wiring substrate (4), the diodes (5) can be easily exchanged.

As described above, in accordance with the present invention, the thermal recording head comprises a plurality of heating elements formed on one end surface; a supporting substrate having a wiring pattern for the connection of departed lead-out wires for the heating elements which are formed on the wide side surface adjacent to the end surface; selective terminals; signal terminals; a wiring pattern for forming a diode matrix formed by the departed lead-out wires for the terminals; a first substrate having diodes whose terminals are respectively connected to the wiring pattern; a wiring pattern connected to the other terminals of the diodes; and a second substrate having the wiring pattern connected in the superposed condition to the wiring pattern formed on the side surface of the supporting substrate. The departed land parts (101) for connecting the lead-out wires of the heating elements are formed on the wide side surface of the supporting substrate whereby the heating elements can be arranged in high density and the assembly is easy because the wiring on the second substrate is soldered at the departed land parts.

In the above-mentioned embodiment of the present invention, the used space of the supporting substrate near the recording surface is remarkably small and the connections of the lead-out wires (2) on the supporting substrate (3) and the wiring for the diode matrix are easily carried out by arranging the joints in two dimensional form with larger gaps whereby the heating elements (1) can be arranged in high density and the disadvantages of the prior art in regard to cost and the space are eliminated.

In accordance with the present invention, the size of the thermal recording head having a small thickness in the running direction for the recording paper can be about half of that of the prior art. Accordingly, the amount of freedom in its design is increased and the use of the expensive substrates made of glass-epoxy resin, polyimide or ceramic can be remarkably reduced. The connections of the lead wires and the assembling of the matrix can be carried out by conventional soldering techniques to impart a remarkable improvement in the manufacture and cost and the improvement of reliability.

We claim:

1. A thermal recording head which comprises a supporting substrate having a wiring pattern wherein a plurality of heating elements arranged linearly and a plurality of lead-out wires connected respectively to each heating element are formed on the end surface and said lead-out wires are elongated to the adjacent side surface; selective terminals connected to a plurality of said heating elements; a first wiring substrate having a wiring pattern having signal terminals for applying a selective signal for selecting the heat elements and a diode matrix connected to said terminals; a second wiring substrate having a wiring pattern for connecting said diode matrix to said lead-out wires; and a plurality of diodes which are connected between said wiring patterns and which form said diode matrix in the space facing said wiring patterns.

2. A thermal recording head according to claim 1 wherein said second wiring substrates are placed to face the both surfaces of said supporting substrate and said wiring pattern on said supporting substrate is connected to said wiring pattern on said second wiring substrate; and said diode matrix is formed in the both gaps on the both surface of said supporting substrate.

3. A thermal recording head according to claim 1 wherein first land parts are formed in said wiring pattern on said supporting substrate and second land parts are formed in the wiring pattern of said second wiring substrate and each hole is formed in each second land part and said second wiring substrate is soldered through each hole to the corresponding first land part on said supporting substrate.

4. A thermal recording head according to claim 1 wherein said second wiring substrate is a flexible substrate and said supporting substrate is connected to said second wiring substrate in the condition of bending said second wiring substrate.

5. A thermal recording head according to claim 1 wherein said wiring substrate is divided into two or more for a predetermined numbers of said heating elements.

6. A thermal recording head according to claim 1 or 5 wherein said first wiring substrate and said second wiring substrate are formed in one piece and each wiring pattern is formed on the both surfaces so as to form said diode matrix and terminals of said diodes in one side are bent to the bending direction and are fixed on said substrate.

* * * * *